(12) United States Patent
Maio et al.

(10) Patent No.: US 6,181,109 B1
(45) Date of Patent: Jan. 30, 2001

(54) METHOD AND APPARATUS FOR MONITORING AND MAINTAINING A PLURALITY OF BATTERIES

(75) Inventors: Stephen T. Maio, Mendham; Thirumalai G. Palanisamy, Morristown; Harmohan Singh, Rockaway; Rainer Tegge, Warren, all of NJ (US)

(73) Assignee: AlliedSignal Inc., Morristown, NJ (US)

( * ) Notice: Under 35 U.S.C. 154(b), the term of this patent shall be extended for 0 days.

(21) Appl. No.: 09/408,675

(22) Filed: Sep. 30, 1999

Related U.S. Application Data

(60) Provisional application No. 60/102,629, filed on Oct. 1, 1998.

(51) Int. Cl.$^7$ .................................................. H02J 7/04
(52) U.S. Cl. ............................................................. 320/150
(58) Field of Search ............................................... 320/150

(56) References Cited

U.S. PATENT DOCUMENTS

| | | | |
|---|---|---|---|
| 4,745,349 | 5/1988 | Palanisamy et al. | 320/125 |
| 4,876,495 | 10/1989 | Palanisamy et al. | 320/66 |
| 4,937,528 | 6/1990 | Palanisamy | 324/430 |
| 4,968,942 | 11/1990 | Palanisamy | 324/430 |
| 5,049,803 | 9/1991 | Palanisamy | 320/132 |
| 5,160,880 | 11/1992 | Palanisamy | 320/106 |
| 5,281,919 | 1/1994 | Palanisamy | 324/427 |
| 5,321,627 | 6/1994 | Reher | 364/483 |
| 5,578,915 | 11/1996 | Couch, Jr. et al. | 320/118 |
| 5,592,094 | 1/1997 | Ichikawa | 320/127 |
| 5,650,712 | 7/1997 | Kawai et al. | 320/DIG. 21 |
| 5,652,502 | 7/1997 | van Phuoc et al. | 320/134 |
| 5,705,929 | 1/1998 | Caravello et al. | 324/430 |
| 5,708,347 | 1/1998 | Palanisamy et al. | 320/132 |
| 5,710,503 | 1/1998 | Sideris et al. | 320/116 |
| 5,808,445 | 9/1998 | Aylor et al. | 320/132 |
| 5,864,237 | 1/1999 | Kawai et al. | 324/430 |
| 5,883,496 | 3/1999 | Esaki et al. | 320/132 |
| 5,886,499 | 3/1999 | Hall | 320/101 |
| 5,929,594 | 7/1999 | Nonobe et al. | 320/104 |
| 5,945,808 | 8/1999 | Kikuchi et al. | 320/132 |
| 5,955,869 | 9/1999 | Rathmann | 320/132 |

*Primary Examiner*—Peter S. Wong
*Assistant Examiner*—Pia Tibbits
(74) *Attorney, Agent, or Firm*—Loria B. Yeadon

(57) ABSTRACT

A method and apparatus for monitoring and maintaining a plurality of batteries. The batteries are maintained according to a two-part method. In the first part, a normal analysis is performed on all of the batteries. In the normal analysis, it is determined if any one of the batteries has marginal conditions. The marginal battery (which can be one or more batteries) is selected for a second part of the method, which includes a detailed analysis. The detailed analysis is performed on the marginal battery. The marginal battery is then serviced according to the results of the detailed analysis.

16 Claims, 7 Drawing Sheets

US 6,181,109 B1

METHOD AND APPARATUS FOR MONITORING AND MAINTAINING A PLURALITY OF BATTERIES

RELATED APPLICATION

The present application claims the priority of U.S. Provisional Application Ser. No. 60/102,629, entitled METHOD AND APPARATUS FOR MONITORING AND MAINTAINING A PLURALITY OF BATTERIES filed on Oct. 1, 1998, the entirety of which is hereby incorporated by reference.

FIELD OF THE INVENTION

The present invention relates generally to electrical batteries, and in particular, a method and apparatus for monitoring and maintaining batteries.

BACKGROUND OF THE INVENTION

A battery is a device that converts the chemical energy contained in its active materials directly into electrical energy by means of an oxidation-reduction electrochemical reaction. This type of reaction involves the transfer of electrons from one material to another. Batteries in the art commonly utilize electrochemical operations to store and release electrical energy.

FIG. 1 illustrates the electrochemical operation of a typical battery. Referring to the figure, the negative electrode (anode 2) is the component capable of giving up electrons, being oxidized during the reaction. It is separated from the oxidizing material, which is the positive electrode (cathode 1), the component capable of accepting electrons. The transfer of electrons takes place in the external electric circuit 11 which connects the two materials 1, 2 while the electrolyte 3 provides an ionic medium for the electron transfer in the battery 4.

Because of the electrochemical nature of batteries, they are degradable products and deteriorate as a result of chemical actions that proceed during storage. Proper maintenance is critical to the operation and functional stability of batteries. There is a general need in the art for maximizing the functional stability of batteries by optimally storing and maintaining batteries. The present invention satisfies this need and others.

SUMMARY OF THE INVENTION

The invention provides a method and apparatus by which the operational characteristics of individual batteries are diagnosed. In a first preferred embodiment, a two-part method for maintaining a plurality of batteries is provided. The method comprises a first part of a normal analysis and a second part of a more detailed analysis. Initially, conditions of the batteries are monitored. The normal analysis is performed on the batteries using the battery conditions monitored. As a result of the normal analysis, the battery detected as marginal is selected. In the second part of the method, additional battery parameters of the marginal battery are measured. The detailed analysis is performed on the marginal battery using the additional battery parameters measured. According to the results of the detailed analysis, the marginal battery is then flagged for service.

According to a specific embodiment of the invention, a plurality of main batteries and a corresponding plurality of auxiliary batteries are maintained. A normal analysis is performed to determine if any one of the main batteries in the battery system is marginal. The marginal battery is disconnected and a corresponding auxiliary battery is switched on. A detailed analysis is then performed on the marginal battery. The marginal battery is serviced according to the results of the detailed analysis and is available for use in the battery system.

BRIEF DESCRIPTION OF THE DRAWINGS

Other features and advantages of the invention will be apparent from the following Detailed Description when read in conjunction with the accompanying Drawings, in which like reference designations represent like features throughout the enumerated Figures. The Drawings referred to herein will be understood as not being drawn to scale except if specifically noted, the emphasis instead being placed upon illustrating the principles of the invention. In the accompanying drawings.

DETAILED DESCRIPTION OF THE PREFERRED EMBODIMENTS

Figure 1:
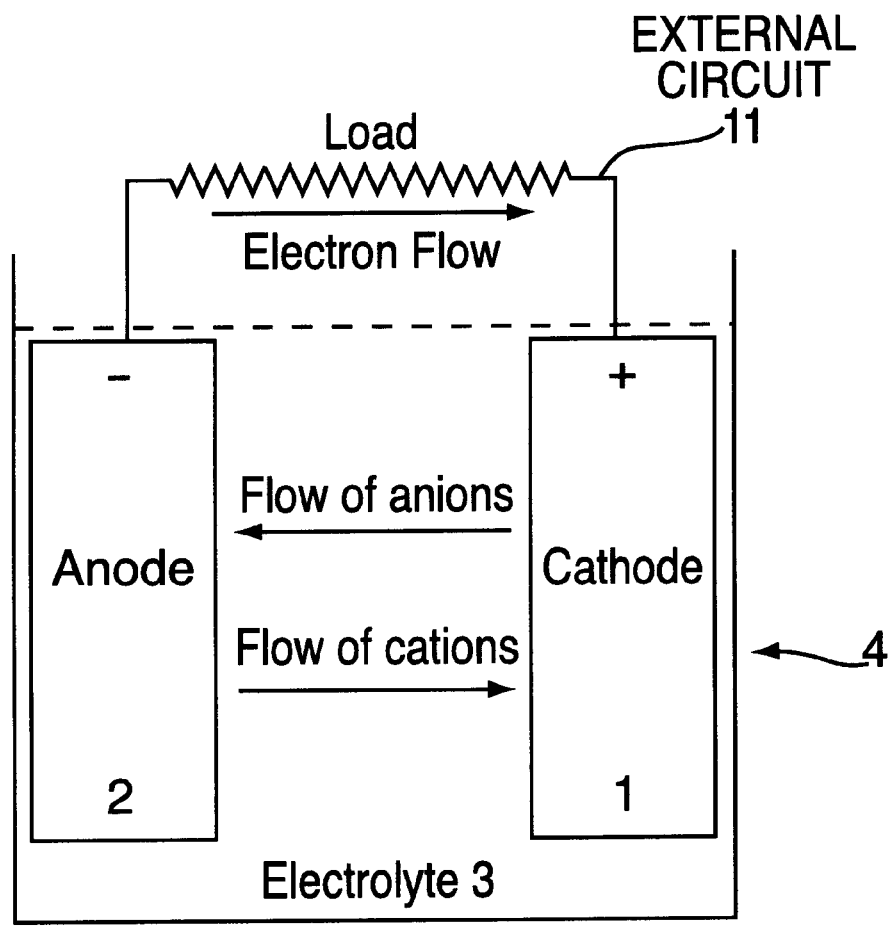
FIG. 1 illustrates the operation of a conventional electrochemical battery.
Figure 2:
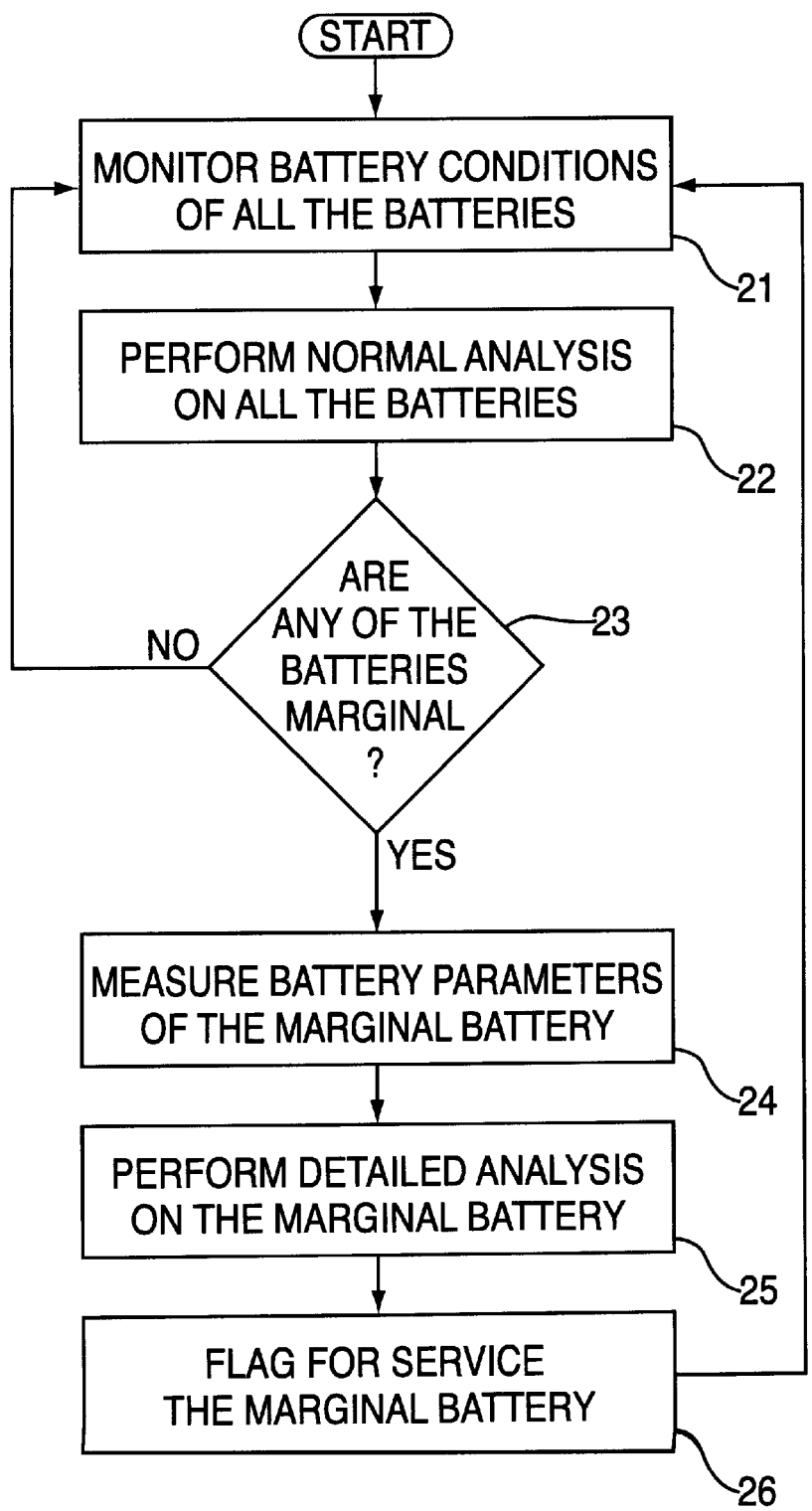
FIG. 2 is a flow diagram illustrating a method in accordance with the invention.

FIG. 2 is a flow diagram illustrating the method of the invention. Referring to FIG. 2, battery conditions of all of the batteries are monitored in Step 21, including conditions from which a determination can be made whether a particular battery is marginal. A normal analysis is performed on all the batteries (Step 22). A "normal analysis" monitors sufficient battery conditions to determine whether a battery is marginal. A "marginal" battery has conditions outside of a prescribed range of suitable values for the intended purpose of the battery. Step 23 determines whether any one of the batteries is marginal. If none of the batteries has marginal battery conditions, then the control flow is reverted to Step 21 and the conditions of the batteries continue to be monitored.

On the other hand, if a battery is determined to be marginal, additional battery parameters of the marginal battery are measured (Step 24) for use in a detailed analysis of that battery (Step 25). Among the additional battery parameters that are measured are the state of charge, electrolyte level, terminal resistance, and battery capacity. The detailed analysis includes analyzing the battery parameters measured to determine the actions required to service the marginal battery. The marginal battery then can be serviced according to the results of the detailed analysis (Step 26). The purpose of the battery servicing is to ensure that the battery operates above marginal condition. In the meantime, the conditions of all the batteries are continuously monitored.

The invention provides a two-part method for maintaining the plurality of batteries comprising a normal analysis followed by a detailed analysis, if necessary. The normal analysis is applied to all batteries during normal operation of the battery system. The detailed analysis is selectively performed on specific batteries based on the results of the normal analysis. Upon detection of marginal batteries among the plurality of batteries, the detailed analysis is performed on the marginal batteries individually. The detailed analysis can also be performed offline or during system down time.

Figure 2A:
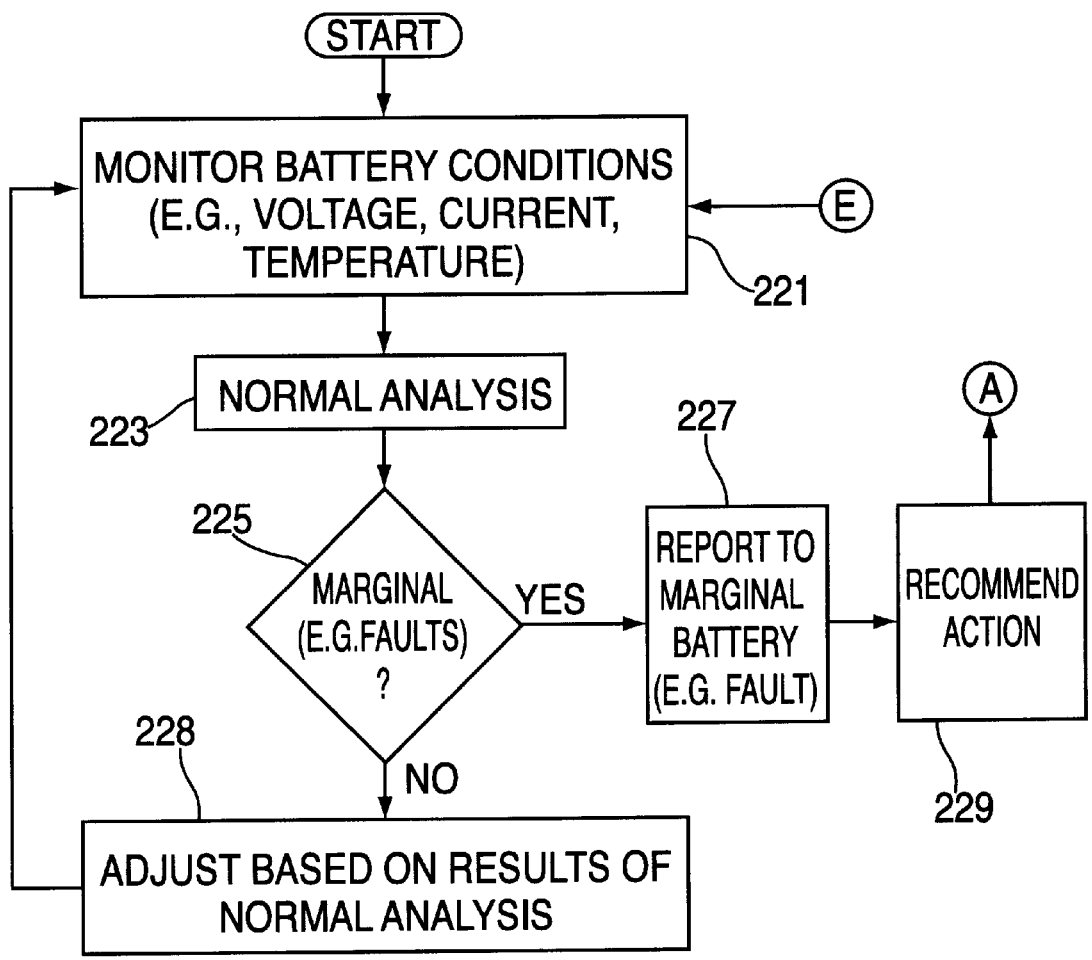
FIGS. 2A and 2B are flow diagrams illustrating a preferred embodiment of the method of the invention.
Figure 2B:
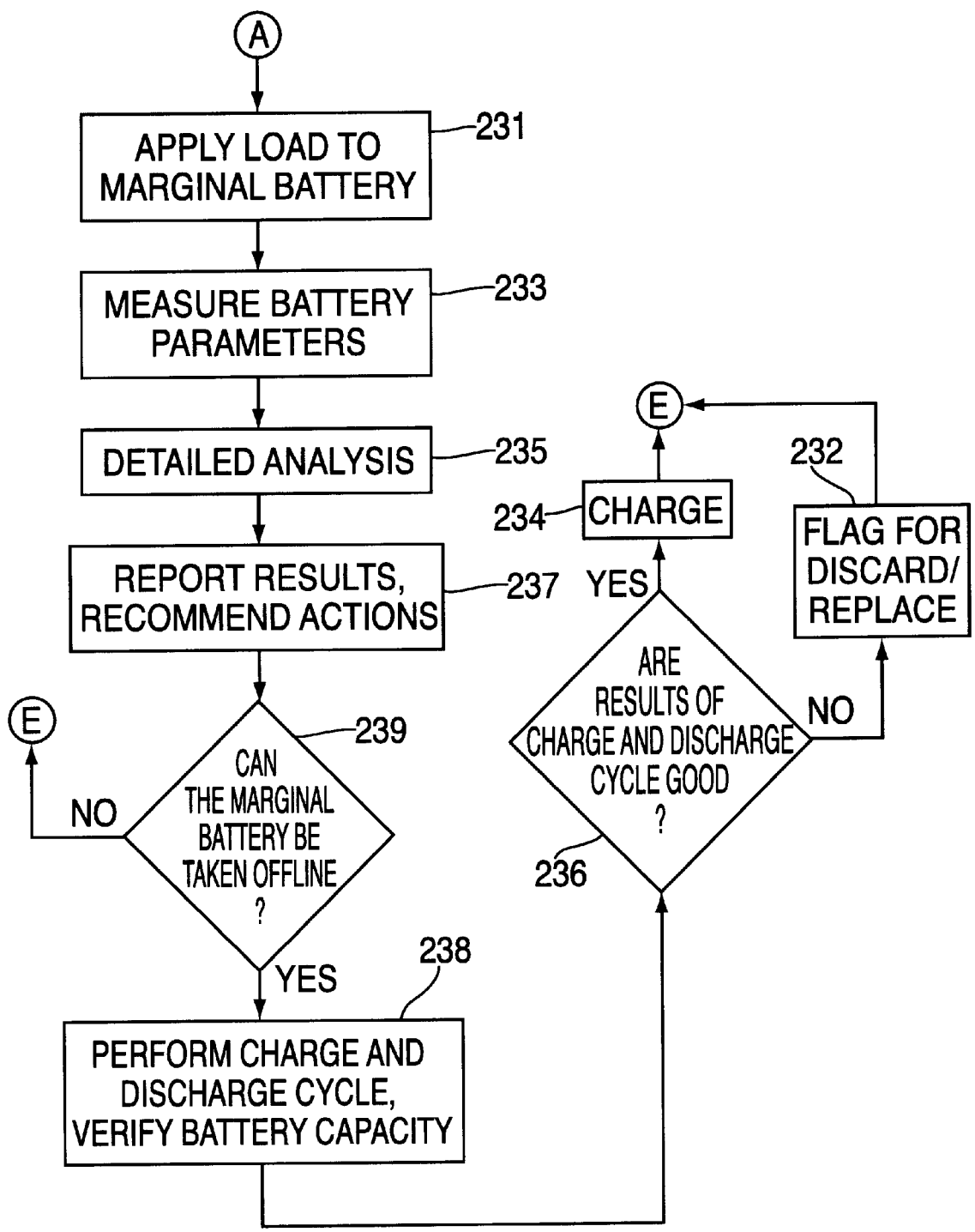

FIGS. 2A and 2B are flow diagrams illustrating a preferred embodiment of the method of the invention. The steps taken to perform the normal analysis and the detailed analysis can be implemented in hardware or software.

Referring to FIG. 2A, some battery conditions, such as voltage, current and temperature conditions, are monitored for each of the plurality of batteries in Step 221 while others are derived from such measurements. The normal analysis on such battery conditions is performed at Step 223 and includes an analysis of:

(1) Battery terminal voltage;
(2) Battery terminal voltage behavior in response to load variation;
(3) Charge and discharge current; and
(4) Battery ambient temperature.

Using the measured voltage, current and temperature data, the internal resistance (IR) and the state of charge (SOC) of a battery can be determined as part of the normal analysis of Step 223. A battery is deemed marginal if any one of its voltage, current and temperature measurements significantly deviates from a prescribed range and/or the rest of the batteries. A battery is also deemed marginal if it has faulty conditions, such as a low SOC or high IR (Step 225). Adjustment can then be made with respect to any marginal battery at Step 228. Any marginal batteries are reported (Step 227) and actions are recommended for the affected battery (Step 229). For example, if a low SOC is detected, which is considered a faulty condition, the low SOC level is reported (Step 227). An action to remedy the low SOC, such as increasing the voltage charge supplied to the marginal battery, or performing a detailed analysis on the marginal battery (Step A), can be recommended (Step 229).

Faulty conditions of the batteries can also be anticipated at Step 225 before they occur. The occurrence and timing of a faulty condition are anticipated by determinations that are made during the course of the normal analysis. For example, a maximum IR limit can be set for each battery and its occurrence anticipated based on the voltage, current and temperature measurements for that battery. In particular, the IR is computed as the measured voltage divided by the measured current and this value can be plotted against the temperature. See FIG. 2C. Preferably, the maximum IR limit is set as one the fault conditions to be detected at Step 225. If no fault condition is detected, then the maximum IR limit optionally can be adjusted at Step 228 in view of the voltage, current and temperature measurements of the normal analysis of Step 223. In the meantime, battery conditions of all of the batteries are continuously monitored.

In a specific embodiment, a plurality of batteries is monitored and each one's IR is determined. Measurements are made at predetermined intervals by monitoring the voltage, current and temperature conditions for each battery. The IR and SOC of each battery, together with the temperature, are then used to determine whether the battery condition is marginal or not. The IR is calculated at a given temperature based on these data, and the basic IR vs. temperature curve can be reconstructed based on calculated IR over the temperature range for the present SOC of the battery. Once the IR vs. temperature curve is obtained from the measured data it is compared with a standard curve of IR vs. temperature based on the requirements of the system. Using this IR limit analysis, battery useful life can be predicted at Step 225 and servicing actions anticipated and reported at Step 227.

Figure 2C:
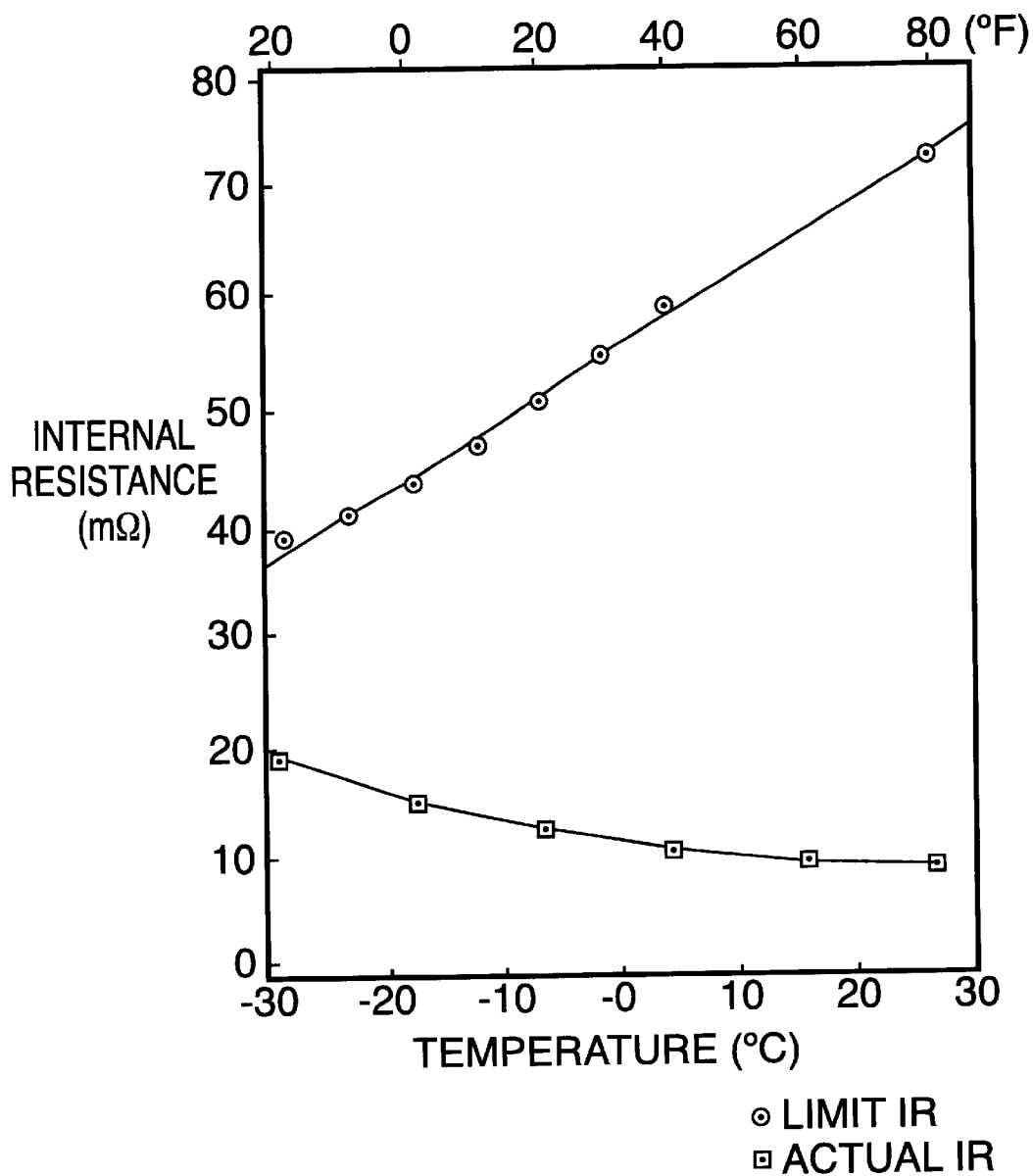
FIG. 2C is a graph illustrating the relationship between the ambient temperature and the internal resistance of a battery.

FIG. 2C depicts the battery IR and the maximum allowable limit of IR as a function of temperature for a typical battery. Such a graph is found in the specifications of most commercially available batteries. The measured IR of a given battery is compared with the maximum allowed by the IR limit curve for that battery or battery type. Based on the temperature conditions being monitored, extrapolations can be made for both the ambient temperature and IR so that the time when a battery will exceed its IR limit can be anticipated. Based on the anticipated information, operational time periods can be anticipated and offline times can be scheduled for individual batteries for servicing. Adjustments are made according to the forecast information at Step 228 of FIG. 2A. Meanwhile, the conditions of all the batteries are monitored on a continuous basis.

Once a marginal battery has been detected, the detailed analysis is performed, as described next. The process of FIG. 2B flows from Step 229 of FIG. 2A. At Step 231, a load is applied to the marginal battery so that additional battery parameters can be measured at Step 233 for the marginal battery. The additional battery parameters include the SOC, electrolyte level, terminal resistance, and battery capacity. The additional battery parameters are used in the detailed analysis step, Step 235, to determine the following:

(1) Mismatched cells, e.g., individual cells within the battery that may be at different capacity levels;
(3) Soft-shorted cells, often found in lead-acid batteries, where the shorted cell behaves like a normal cell with low capacity during charge, but becomes a dead cell and loses voltage during discharge and in long open circuit periods;
(4) Reverse connections (during initial installations), where the positive terminal of a battery is connected to a negative terminal of the charger, and the negative terminal of the battery is connected to the positive terminal of the charger;
(5) High terminal resistance, which leads to a substantial voltage drop that reduces the power available for use in the system;
(6) Low electrolyte level, which causes non-uniformity in electrolyte concentration and negatively affects ionic transfer;
(7) Corroded terminals, which lead to a substantial increase in resistance at the terminal-to-wire connections.
(8) Battery status, such as:
   Battery capacity,
   Electrolyte adequacy, and
   State of charge (SOC);
(8) Time to maintain/replace individual batteries, such as the end of a battery's useful life; and
(9) Current or voltage ramp test.

For example, a current or voltage ramp test provides a profile of current or voltage over increasing applied current or voltage (ramp up) and over decreasing applied current or voltage (ramp down) directions. The SOC is determined of the marginal battery from the current during the ramp down portion of the test. Battery capacity is derived from the SOC.

The results of the detailed analysis are reported and actions are recommended at Step 237. For example, a marginal battery affected with a faulty condition can be replaced, e.g., by switching to another battery. If a reverse connection was detected in Step 235, the condition is reported (Step 237) and the reverse connection is rectified manually. Likewise, if a low electrolyte level was detected, the condition is reported and electrolyte is added. If it is time to maintain or replace the marginal battery, e.g., because the maximum IR limit is reached, the marginal battery is disconnected for servicing or replacement. Alternatively, if a high terminal resistance or corroded terminal condition were detected, such conditions would be reported and the affected battery disconnected for servicing (e.g., terminal cleaning). The battery power shortfall while the marginal battery is disconnected can be supplanted by switching on another battery, that is, an auxiliary battery. If inadequate state of charge (SOC) was detected, then a determination is made whether the marginal battery can be taken offline by shutting down the battery system in Step 239. If the marginal battery cannot be taken offline, e.g., the battery power being supplied by the system cannot be interrupted, then the control flows back (via Step E) to Step 221 of FIG. 2A, where battery conditions of all the batteries are continuously monitored.

If the marginal battery can be taken offline, then a charge/discharge cycle is performed and the battery capacity is detected and verified for normal operation (Step 238). The results of the charge/discharge cycle are evaluated in Step 236. If the results are within a prescribed range, the marginal battery is charged and then returned in-line for normal operation in the battery circuit. The control flow is then reverted back to Step 221 of FIG. 2A, where battery conditions of all the batteries are continuously monitored.

If the results of the charge/discharge cycle are outside of a prescribed range, then the marginal battery is flagged for discarding or replacement (Step 232). The control flow is then reverted back (via Step E) to Step 221 of FIG. 2A, where battery conditions of all the batteries are continuously monitored.

Figure 3:
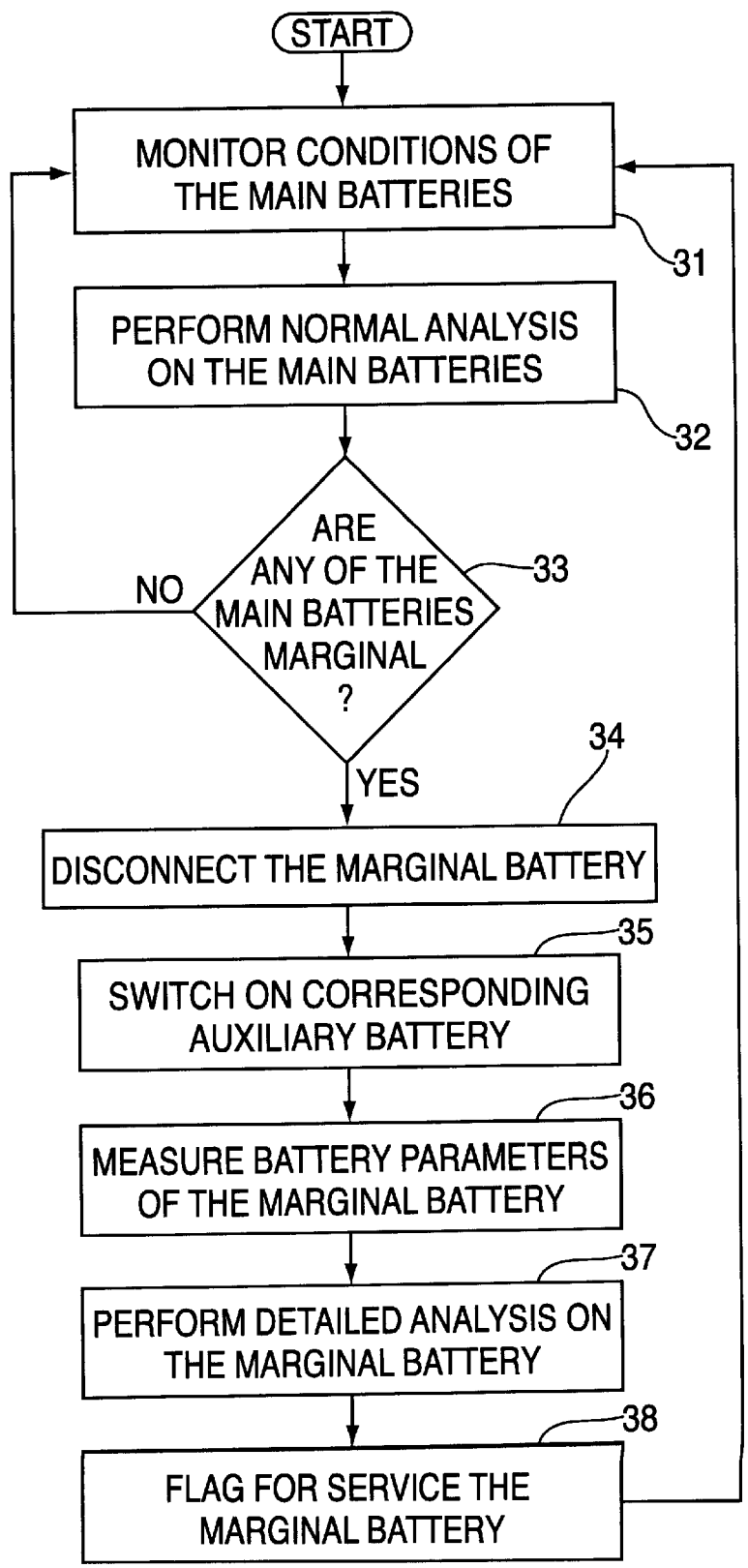
FIG. 3 is a flow diagram illustrating a specific embodiment of the method of FIG. 2 for an uninterruptible power/generator system (UPS) having main and auxiliary batteries.

The method of the invention can also be applied to an uninterruptible power/generator system (UPS) having a set of main batteries and a set of auxiliary batteries. With reference now to FIG. 3, the operating conditions of the main batteries are continuously monitored at Step 31. Normal analysis is performed at Step 32 and a determination is made at Step 33 as to whether any of the main batteries is marginal, substantially as described above in connection with Steps 21–23. If no marginal battery is detected, the control flow then reverts to Step 31.

On the other hand, if a marginal battery is detected, the marginal battery is disconnected (Step 34) and a corresponding auxiliary battery is switched into the circuit to maintain battery power supply (Step 35). Additional battery parameters of the affected battery are measured at Step 36 and a detailed analysis is performed using such battery parameters measured (Step 37), substantially as described above. The marginal battery is then flagged for service in accordance with the results of the detailed analysis (Step 38). The control flow then reverts to Step 31, where the conditions of the main batteries are continuously monitored.

Figure 4:
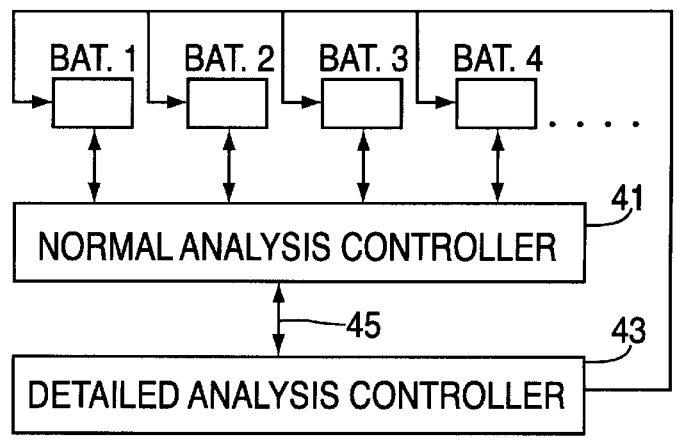
FIG. 4 is a block diagram generally illustrating the system of the invention.

FIG. 4 is a block diagram generally illustrating a system in accordance with this embodiment of the invention. Referring to FIG. 4, a normal analysis controller 41 performs the normal analysis steps that were previously described. Also provided is a detailed analysis controller 43, connected to the normal analysis controller 41 and responsive to signals therefrom over line 45, which performs the detailed analysis steps described above. A plurality of batteries (BAT. 1, BAT. 2, BAT. 3, BAT. 4, . . . ) is connected to both the normal analysis controller 41 and the detailed analysis controller 43. The detailed analysis controller 43 can override the normal analysis controller 41 when service for any of the batteries is required.

Figure 5:
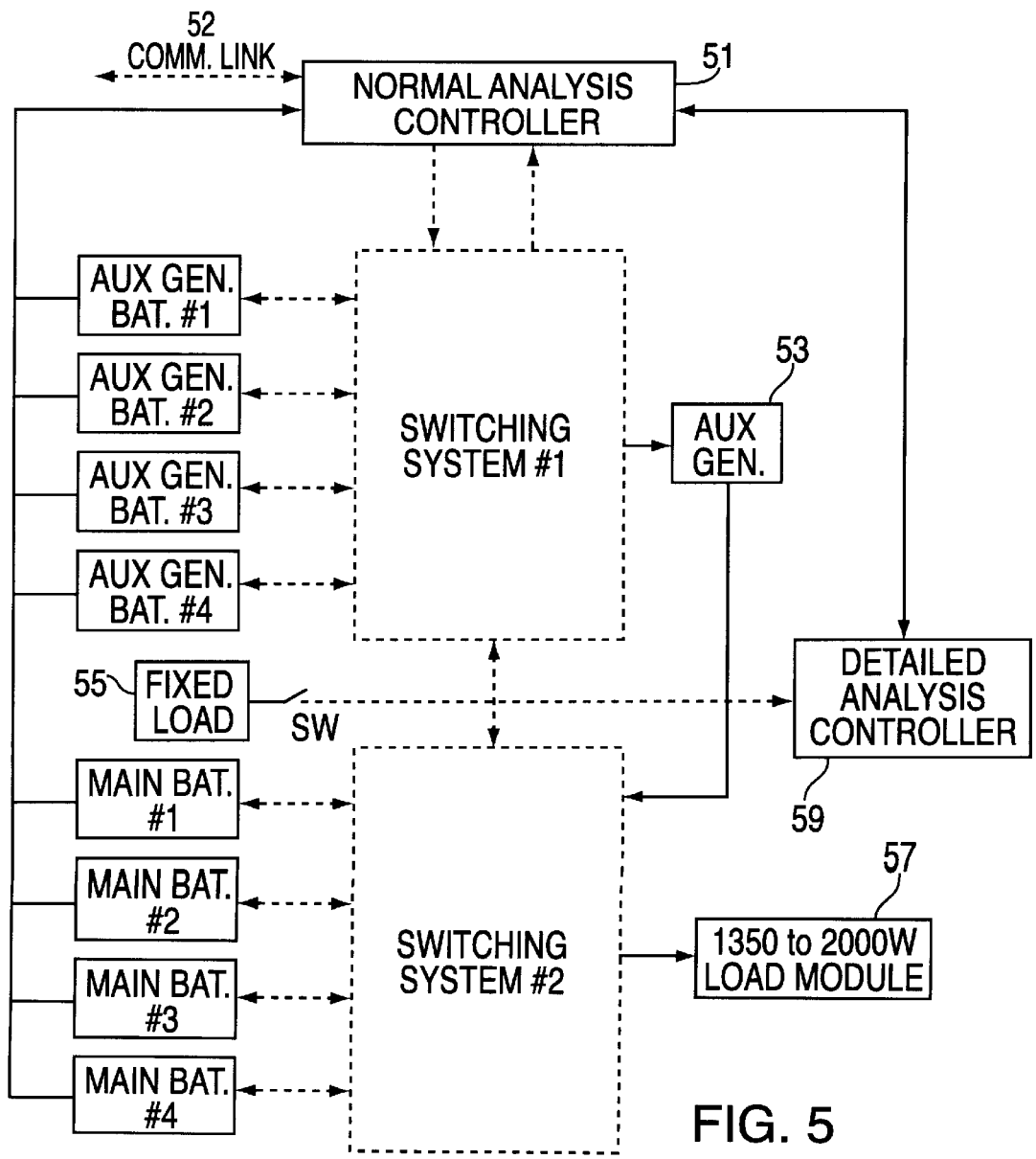
FIG. 5 is a block diagram illustrating a particular application of the invention as embodied in an uninterruptible power/generator system (UPS) having main and auxiliary batteries.

FIG. 5 is a detailed block diagram illustrating a preferred application for a UPS. Referring to FIG. 5, a normal analysis controller 51 is coupled to a plurality of batteries, MAIN BAT. 1–4 and AUX GEN. BAT. 1–4. The batteries used in the system are rechargeable batteries of a type commonly used in the art, such as nickel-cadmium, nickel-hydrogen, nickel-zinc, nickel-iron, silver-zinc, zinc bromine, zinc-chlorine, and lead-acid batteries. The normal analysis controller 51 continuously analyzes the prevailing battery conditions and implements maintenance and charging functions as described above. The battery conditions can be monitored when the load (such as the UPS) itself draws current from the battery bank, e.g., when AUX GEN. 53 is started or when the AC power source is operational. When the UPS is not providing power, the normal analysis controller 51 continues to monitor and analyze the temperature, voltage and current conditions from which it determines the IR and SOC of each battery with changes in temperature. The individual battery's IR and SOC, together with the temperature, are then used to determine whether the battery condition is marginal.

The normal analysis controller 51 flags as marginal any one of the plurality of batteries which is found to have one or more faulty conditions, such as a low SOC or high IR. Any marginal or faulty conditions identified by the normal analysis controller 51 are reported to the detailed analysis controller 59 for further detailed analysis.

COMM LINK 52 provides remote communication and programming capabilities for the normal analysis controller 51 and also the detailed analysis controller 59. For example, complete charge/discharge cycles can be performed by remote commands transmitted via COMM LINK 52 on a periodic basis, e.g., once per year.

The normal analysis controller 51 is coupled to the detailed analysis controller 59, which can override the analytical and implementing functions of the normal analysis controller 51. In addition, the detailed analysis controller 59 has the ability to re-initialize the algorithms of the normal analysis controller 51, depending on a diagnostic analysis or any change in conditions. The detailed analysis controller 59 is also coupled to the fixed load 55, through a switch SW.

The detailed analysis controller 59 can override the automatic status monitoring of the normal analysis controller 51, invoke self tests, upload self test results, upload individual battery voltage, current and temperature data, perform voltage or current ramp tests, disable individual batteries, and upgrade software algorithms which are resident in the normal analysis controller 51.

For example, the detailed analysis controller 59 can perform the current or voltage ramp test as described above, with the state of charge being determined from the current in the ramp down direction. The battery capacity of the marginal battery is determined based on the state of charge.

The main battery group of MAIN BAT. 1–4 is coupled to SWITCHING SYSTEM 2. The auxiliary battery group of AUX GEN. BAT. 1–4 is coupled to SWITCHING SYSTEM 1. SWITCHING SYSTEM 1 is coupled to a auxiliary power generator AUX GEN. 53, whose output is coupled to SWITCHING SYSTEM 2. SWITCHING SYSTEM 2 is coupled to a power load module for alternating current (AC) power generation, i.e., 1350 W to 2000 W Load Module 57.

In operating the battery system, main battery power (from MAIN. BAT. 1–4) is routed through SWITCHING SYSTEM 2 which either connects the main battery power to a load module (i.e., 1350 to 2000 W Load Module 57) for AC power generation or to the normal analysis controller 51 for analysis and maintenance. If any marginal batteries are detected, SWITCHING SYSTEM 2 is commanded by the normal analysis controller 51 to isolate the affected batteries for later servicing.

The auxiliary generator battery power (generated by AUX GEN. BAT. 1–4) is also routed through a switching system (SWITCHING SYSTEM 1). SWITCHING SYSTEM 1 either connects the AUX GEN. BAT. 1–4 to the auxiliary generator (AUX. GEN.) for contingent power generation or to the normal analysis controller 51 for analysis, charging or isolation as required by the algorithms resident in the normal analysis controller 51.

The aforementioned switching systems provide flexibility and optimal performance by allowing the battery system to allocate power resources based on the conditions of each battery. For example, if a main battery is defective, or malfunction is anticipated therefor, the system can simply isolate that main battery for service and switch to an auxiliary generator battery. The auxiliary generator battery, e.g., AUX GEN. BAT. 1, can then start AUX GEN. 53 as an alternative power generation source.

An exemplary operation of the system of the invention as embodied in the UPS of FIG. 5 is illustrated herein. During normal operation, each battery is automatically connected to its corresponding functional power grid for immediate use. The conditions of the main batteries (MAIN BAT. 1–4) are continuously monitored. The normal analysis controller 51 performs a normal analysis on the main batteries (MAIN BAT. 1–4) using the conditions monitored. The normal analysis controller 51 determines if any of the main batteries is marginal. The fixed load 55 is automatically switched on during the normal analysis performed by the normal analysis controller 51.

If a marginal battery is detected (e.g., MAIN BAT. 1), using SWITCHING SYSTEM 1 and SWITCHING SYSTEM 2 the marginal battery is disconnected and a corresponding auxiliary battery is switched on to maintain battery power supply. Thereafter, additional battery parameters of the marginal battery (MAIN BAT. 1) are measured. The detailed analysis controller 59 performs a detailed analysis on the marginal battery (MAIN BAT. 1) using such battery parameters measured. The marginal battery (MAIN BAT. 1) is then flagged for service according to the results of the detailed analysis.

An advantage of the invention is that charging characteristics are automatically adjusted to suit each battery, with each battery being charged with maximum efficiency and speed. According to the invention, a battery is not recharged if it is determined that it has been fully charged after analyzing its state of charge. The batteries advantageously operate at peak efficiency with enhanced battery life and the inventive system and method eliminate the need for continuous charging. The advantages of the invention further include reduction in total battery cost and prolonged battery life. In addition, all testing and maintenance functions are easily reconfigurable and can be upgraded any time, by instructing the detailed analysis controller to revise algorithms in the normal analysis control. The end of useful life or malfunctions of the batteries are anticipated by a trend analysis of the internal resistance (IR), battery capacity and their respective limits. The efficiency of maintaining the batteries is optimized since battery malfunctions are anticipated and battery maintenance scheduled before such failures are encountered.

Thus, while there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

We claim:

1. A two-part method for maintaining a plurality of batteries, having a first part comprising a normal analysis and a second part comprising a detailed analysis, the method comprising the steps of:

monitoring battery conditions of the plurality of batteries;

performing the normal analysis on the plurality of batteries using the monitored battery conditions;

selecting at least one battery which is detected as being marginal by the normal analysis;

measuring battery parameters of the marginal battery;

performing the detailed analysis on the marginal battery using the measured battery parameters; and flagging for service the marginal battery according to the results of the detailed analysis.

2. The method of claim 1, wherein the battery conditions of the plurality of batteries are monitored continuously.

3. The method of claim 1, wherein the detailed analysis overrides the normal analysis.

4. The method of claim 1, further comprising the steps of:

selectively supplying a voltage charge to each of the batteries;

monitoring state of charge (SOC) of the plurality of batteries; and adjusting the voltage charge according to the state of charge (SOC) monitored.

5. The method of claim 1, further comprising a step of recommending actions to service the marginal battery.

6. The method of claim 1, further comprising a step of increasing voltage charge to the marginal battery if the marginal battery has low state of charge (SOC).

7. The method of claim 1, wherein the conditions monitored consist of battery terminal voltage, battery ambient temperature, charge and discharge current.

8. The method of claim 1, wherein the battery parameters measured consist of mismatched cells, soft-shorted cells, reverse connections, high terminal resistance, low electrolyte level, corroded terminals, power system status, battery capacity, state of charge, and time to maintain/replace battery.

9. The method of claim 1, further comprising a step of determining if the marginal battery can be taken offline.

10. The method of claim 9, further comprising additional steps of:

performing a charge/discharge cycle on the marginal battery; and verifying battery capacity of the marginal battery;

provided it is determined that the marginal battery can be taken offline.

11. The method of claim 10, further comprising a step of evaluating results of the charge/discharge cycle performed.

12. The method of claim 11, further comprising a step of charging the marginal battery if the evaluated results are within a prescribed range.

13. The method of claim 11, further comprising a step of replacing the marginal battery if the evaluated results are outside of a prescribed range.

14. The method of claim 1, further comprising additional steps of:

analyzing internal resistance (IR) of the batteries; and anticipating a time when the IR reaches an IR limit.

15. The method of claim 14, wherein useful life of the batteries is predicted based on the internal resistance analysis and the IR limit.

16. The method of claim 1, further comprising the steps in a programmed machine of:

determining an internal resistance (IR) versus temperature curve;

comparing the IR versus temperature curve with a reference IR versus temperature curve; and extrapolating from the comparison a time when an IR limit is reached.

* * * * *